(12) United States Patent
Bilger et al.

(10) Patent No.: US 11,156,753 B2
(45) Date of Patent: Oct. 26, 2021

(54) OPTICAL FILTERS

(71) Applicant: Viavi Solutions Inc., Milpitas, CA (US)

(72) Inventors: Markus Bilger, Santa Rosa, CA (US); Richard A. Bradley, Jr., Santa Rosa, CA (US)

(73) Assignee: VIAVI Solutions Inc., San Jose, CA (US)

( * ) Notice: Subject to any disclaimer, the term of this patent is extended or adjusted under 35 U.S.C. 154(b) by 364 days.

(21) Appl. No.: 15/845,607

(22) Filed: Dec. 18, 2017

(65) Prior Publication Data
US 2019/0187347 A1 Jun. 20, 2019

(51) Int. Cl.
*G02B 5/20* (2006.01)
*G01J 1/04* (2006.01)
(Continued)

(52) U.S. Cl.
CPC ............ *G02B 5/208* (2013.01); *G01J 1/0214* (2013.01); *G01J 1/0492* (2013.01); *G01J 3/0262* (2013.01); *G02B 1/11* (2013.01); *G02B 5/201* (2013.01); *G02B 5/281* (2013.01); *G02B 5/282* (2013.01); *G03F 7/0007* (2013.01); *G01J 2003/123* (2013.01); *G01J 2003/1213* (2013.01); *G01J 2003/1226* (2013.01); *G02B 5/003* (2013.01); *G02B 13/146* (2013.01)

(58) Field of Classification Search
CPC .......... G02B 5/208; G02B 1/11; G02B 5/201; G02B 5/281; G02B 5/282; G02B 5/003; G02B 13/146; G01J 1/0214; G01J 1/0492; G01J 3/0262; G01J 2003/1213; G01J 2003/1226; G01J 2003/123; G03F 7/0007
See application file for complete search history.

(56) References Cited

U.S. PATENT DOCUMENTS 6,342,970 B1 1/2002 Sperger et al.
6,468,703 B1 10/2002 Edlingger et al.
(Continued)

FOREIGN PATENT DOCUMENTS

EP 1592067 A1 11/2005
EP 2033019 A2 3/2009
(Continued)

OTHER PUBLICATIONS

Macleod, "Thin-Film Optical Filters; Fourth Edition," Series in Optics and Optoelectronics, 2010, ISBN: 978-1-4200-7302-7, 791 pages.
(Continued)

*Primary Examiner* — Georgia Y Epps
*Assistant Examiner* — Don J Williams
(74) *Attorney, Agent, or Firm* — Harrity & Harrity, LLP (57) ABSTRACT

An optical filter may include a monolithic substrate. The optical filter may include a first component filter disposed onto a first region of the monolithic substrate. The first component filter may be a near infrared (NIR) bandpass filter. The optical filter may include a second component filter disposed onto a second region of the monolithic substrate. The second component filter may include a red-green-blue (RGB) bandpass filter. A separation between the first component filter and the second component filter may be less than approximately 50 micrometers (μm).

20 Claims, 8 Drawing Sheets

(51) Int. Cl.
*G01J 3/02* (2006.01)
*G02B 5/28* (2006.01)
*G01J 1/02* (2006.01)
*G02B 1/11* (2015.01)
*G03F 7/00* (2006.01)
*G02B 5/00* (2006.01)
*G01J 3/12* (2006.01)
*G02B 13/14* (2006.01)

(56) References Cited

U.S. PATENT DOCUMENTS

| | | | |
|---|---|---|---|
| 6,879,450 B2 | | 4/2005 | Edlingger et al. |
| 10,368,022 B2* | | 7/2019 | Wan ................ H01L 27/14621 |
| 2002/0094484 A1 | | 7/2002 | Buchsbaum et al. |
| 2003/0116270 A1 | | 6/2003 | Hawa et al. |
| 2006/0098097 A1* | | 5/2006 | Wach ................ G02B 27/0025 |
| | | | 348/207.99 |
| 2008/0042782 A1 | | 2/2008 | Wang et al. |
| 2008/0165421 A1 | | 7/2008 | Matsumoto et al. |
| 2009/0302407 A1 | | 12/2009 | Gidon et al. |
| 2009/0321865 A1 | | 12/2009 | Kasano et al. |
| 2010/0091224 A1 | | 4/2010 | Cho et al. |
| 2010/0091225 A1 | | 4/2010 | Cho et al. |
| 2010/0140461 A1 | | 6/2010 | Sprigle et al. |
| 2010/0296028 A1* | | 11/2010 | Nakai ................ G02F 1/133502 |
| | | | 349/96 |
| 2011/0049340 A1 | | 3/2011 | Tisserand et al. |
| 2011/0260059 A1* | | 10/2011 | Jiang ................ H01L 27/1461 |
| | | | 250/330 |
| 2014/0151575 A1 | | 6/2014 | Hillmer et al. |
| 2014/0210031 A1* | | 7/2014 | Hendrix ........... H01L 27/14643 |
| | | | 257/432 |
| 2014/0307309 A1* | | 10/2014 | Downing ............... G02B 5/285 |
| | | | 359/359 |
| 2014/0339606 A1 | | 11/2014 | Lin et al. |
| 2015/0276478 A1 | | 10/2015 | Geelen et al. |
| 2016/0099280 A1 | | 4/2016 | Huang et al. |
| 2016/0274283 A1 | | 9/2016 | Ueda |
| 2017/0183255 A1 | | 6/2017 | Walther et al. |
| 2017/0219903 A1 | | 8/2017 | Strong et al. |
| 2017/0261752 A1* | | 9/2017 | Koshihara ................ G02B 5/20 |
| 2018/0106935 A1 | | 4/2018 | Zhang |
| 2019/0250316 A1* | | 8/2019 | Ohnishi ................... G02B 5/22 |
| 2019/0258058 A1* | | 8/2019 | Fortin-Desch nes ...................... |
| | | | G02B 27/0093 |

FOREIGN PATENT DOCUMENTS

| | | | |
|---|---|---|---|
| EP | 2209023 A1 | 7/2010 | |
| EP | 2492251 A1 | 8/2012 | |
| EP | 2624020 A1 | 8/2013 | |
| EP | 2996150 A2 | 3/2016 | |
| EP | 3206060 A1 | 8/2017 | |
| JP | 2012019113 A | 1/2012 | |
| WO | 2012004934 A1 | 1/2012 | |
| WO | 2017079051 A1 | 5/2017 | |
| WO | 2017147991 A1 | 9/2017 | |

OTHER PUBLICATIONS

Extended European Search Report for Application No. EP18211892. 7, dated Apr. 18, 2019, 7 pages.
Schallenberg U.B., et al., "Spectral-Sensitive On-chip Masking of Si-PIN-diodes Using Patterned and Self-blocked Optical Coatings", Proceedings of SPIE, Optical and Infrared Thin Films, vol. 4094, Oct. 19, 2000, 7 pages, Date of Issue [URL: https://doi.org/10.1117/12.404753 (https://doi.org/10.1117/12.404753].
Bauer T., et al., "Bandpass Filter Arrays Patterned by Photolithography for Multispectral Remote Sensing", Proceedings of SPIE 9241, Sensors, Systems, and Next-Generation Satellites, Netherlands, Oct. 7, 2014, 9 pages.
Broßmann J., et al., "Low-loss Interference Filter Arrays Made by Plasma-assisted Reactive Magnetron Sputtering (PARMS) for High-performance Multispectral Imaging", Proceedings of SPIE, Sensors, Systems, and Next-Generation Satellites, 2016, vol. 10000, pp. 320-328.
Frey L., et al., "Multispectral Interference Filter Arrays With Compensation of Angular Dependence or Extended Spectral Range", Optics Express, May 4, 2015, vol. 23(9), pp. 11799-11812.
Lapray P.-J., et al., "Multispectral Filter Arrays: Recent Advances and Practical Implementation", Sensors, Nov. 17, 2014, vol. 14, pp. 21626-21659.

* cited by examiner

OPTICAL FILTERS

BACKGROUND

An optical sensor device may be utilized to capture information. For example, the optical sensor device may capture information relating to a set of electromagnetic frequencies. The optical sensor device may include a set of sensor elements (e.g., optical sensors, spectral sensors, and/or image sensors) that capture the information. For example, an array of sensor elements may be utilized to capture information relating to multiple frequencies. In one example, an array of sensor elements may be utilized to capture information regarding a particular spectral range, such as a spectral range of from approximately 400 nanometers (nm) to approximately 700 nm, a spectral range of from approximately 700 nm to approximately 1100 nm, a subrange thereof, or the like. A sensor element, of the sensor element array, may be associated with a filter. The filter may include a passband associated with a first spectral range of light that is passed to the sensor element. The filter may be associated with blocking a second spectral range of light from being passed to the sensor element.

SUMMARY

According to some possible implementations, an optical filter may include a monolithic substrate. The optical filter may include a first component filter disposed onto a first region of the monolithic substrate. The first component filter may be a near infrared (NIR) bandpass filter. The optical filter may include a second component filter disposed onto a second region of the monolithic substrate. The second component filter may include a red-green-blue (RGB) bandpass filter. A separation between the first component filter and the second component filter may be less than approximately 50 micrometers ($\mu m$).

According to some possible implementations, an optical system may include an optical filter including a plurality of component filters configured to filter an input optical signal and provide a filtered input optical signal. The plurality of component filters may be associated with two or more spectral ranges. The plurality of component filters may be disposed onto a single substrate using a photolithography procedure. An optical sensor may be configured to receive the filtered input optical signal and provide an output electrical signal.

According to some possible implementations, a bandpass filter may include a first patterned component filter. The first patterned component filter may include a first set of filter layers associated with a first refractive index and deposited using a sputter deposition technique. The first patterned component filter may include a second set of filter layers associated with a second refractive index that is less than the first refractive index and deposited using the sputter deposition technique. The bandpass filter may include a second patterned component filter. The second patterned component filter may include a third set of filter layers associated with a third refractive index and deposited using the sputter deposition technique. The second patterned component filter may include a fourth set of filter layers associated with a fourth refractive index and deposited using the sputter deposition technique. The first component filter may be separated from the second component filter by less than approximately 30 micrometers ($\mu m$). The first component filter may be associated with a first bandpass and the second component filter is associated with a second bandpass that is different from the first bandpass.

DETAILED DESCRIPTION

The following detailed description of example implementations refers to the accompanying drawings. The same reference numbers in different drawings may identify the same or similar elements.

An optical sensor device may include a sensor element array of sensor elements to receive light initiating from an optical source, such as an optical transmitter, a light bulb, an ambient light source, and/or the like. The optical sensor device may utilize one or more sensor technologies, such as a complementary metal-oxide-semiconductor (CMOS) technology, a charge-coupled device (CCD) technology, and/or the like. A sensor element (e.g., an optical sensor), of the optical sensor device, may obtain information (e.g., spectral data) regarding a set of electromagnetic frequencies. The sensor element may be an indium-gallium-arsenide (InGaAs) based sensor element, a silicon germanium (SiGe) based sensor element, and/or the like.

A sensor element may be associated with a filter that filters light to the sensor element to enable the sensor element to obtain information regarding a particular spectral range of electromagnetic frequencies. For example, the sensor element may be aligned with a filter with a passband in a spectral range of approximately 400 nanometers (nm) to approximately 700 nm, a spectral range of approximately 700 nm to approximately 1100 nm, a subrange thereof, and/or the like to cause a portion of light that is directed toward the sensor element to be filtered. A filter may include sets of dielectric layers to filter the portion of the light. For example, a filter may include dielectric filter stacks of alternating high index layers and low index layers, such as alternating layers of hydrogenated silicon (Si:H or SiH) or germanium (Ge) as a high index material and silicon dioxide ($SiO_2$) as a low index material.

Some sensor element arrays may be configured to receive multiple wavelengths of light. For example, for a sensor element array being used to perform iris recognition, the sensor element array may be configured to receive a first portion of light in a near infrared (NIR) spectrum and a second portion of light in a visible light spectrum (e.g., a red-green-blue (RGB) spectrum). In this case, multiple filters (e.g., an NIR passband filter and an RGB passband filter) may be disposed between the sensor element array and a subject. For example, a first filter may be disposed on a first substrate to enable NIR light to pass through the first filter and a second filter may be disposed on a second substrate to enable RGB light to pass through the second filter. In this case, the first substrate may be attached to the second substrate using an opaque adhesive to form a butt joint, and aligned to the sensor element array to enable the NIR light and the RGB light to be directed toward the sensor element array.

However, use of multiple filters disposed onto multiple substrates and attached together may result in poor mechanical durability. For example, utilization of the adhesive to attach the first substrate to the second substrate may result in relatively poor mechanical strength as a result of part-part planarity for the first substrate and second substrate and bond line variation for the adhesive. Moreover, the utilization of an adhesive to join the first filter and the second filter may result in a spacing between the first filter and the second filter of greater than 50 micrometers (μm), greater than 100 μm, and/or the like, thereby increasing a total package size of the sensor element array and the filters.

Some implementations, described herein, provide multiple component filters integrated onto a common substrate by applying patterned coatings to different sections of the common substrate. For example, a photolithography procedure, a sputter deposition procedure, a patterning procedure, an etching procedure, a combination thereof, and/or the like may be utilized to integrate multiple component filters onto a single, monolithic substrate to form a single optical filter with multiple passbands at multiple regions of the single optical filter. In this way, the optical filter may enable optical sensing, such as for NIR spectrum and visible spectrum combined sensing for iris recognition, low-light security photography, and/or the like. In some implementations, described herein, the optical filter may include, as component filters, an NIR bandpass filter and an infrared (IR) cut filter, an NIR bandpass filter and an RGB bandpass filter, an RGB bandpass filter and an ultraviolet (UV) bandpass filter, and/or the like.

In this way, integration of multiple component filters onto a single, monolithic substrate may provide improved mechanical durability relative to an adhesive based butt joint. Moreover, utilizing a photolithography technique, a sputter deposition technique, a patterning technique, and/or the like to integrate the multiple component filters onto the single substrate may reduce a spacing between the component filters to less than 50 μm, less than 30 μm, less than 20 μm, less than 10 μm, and/or the like. In this way, a package size of a sensor element array including an optical filter with multiple component filters may be reduced, thereby improving miniaturization of optical sensors for iris recognition, low-light security photography, and/or the like.

Figure 1A:
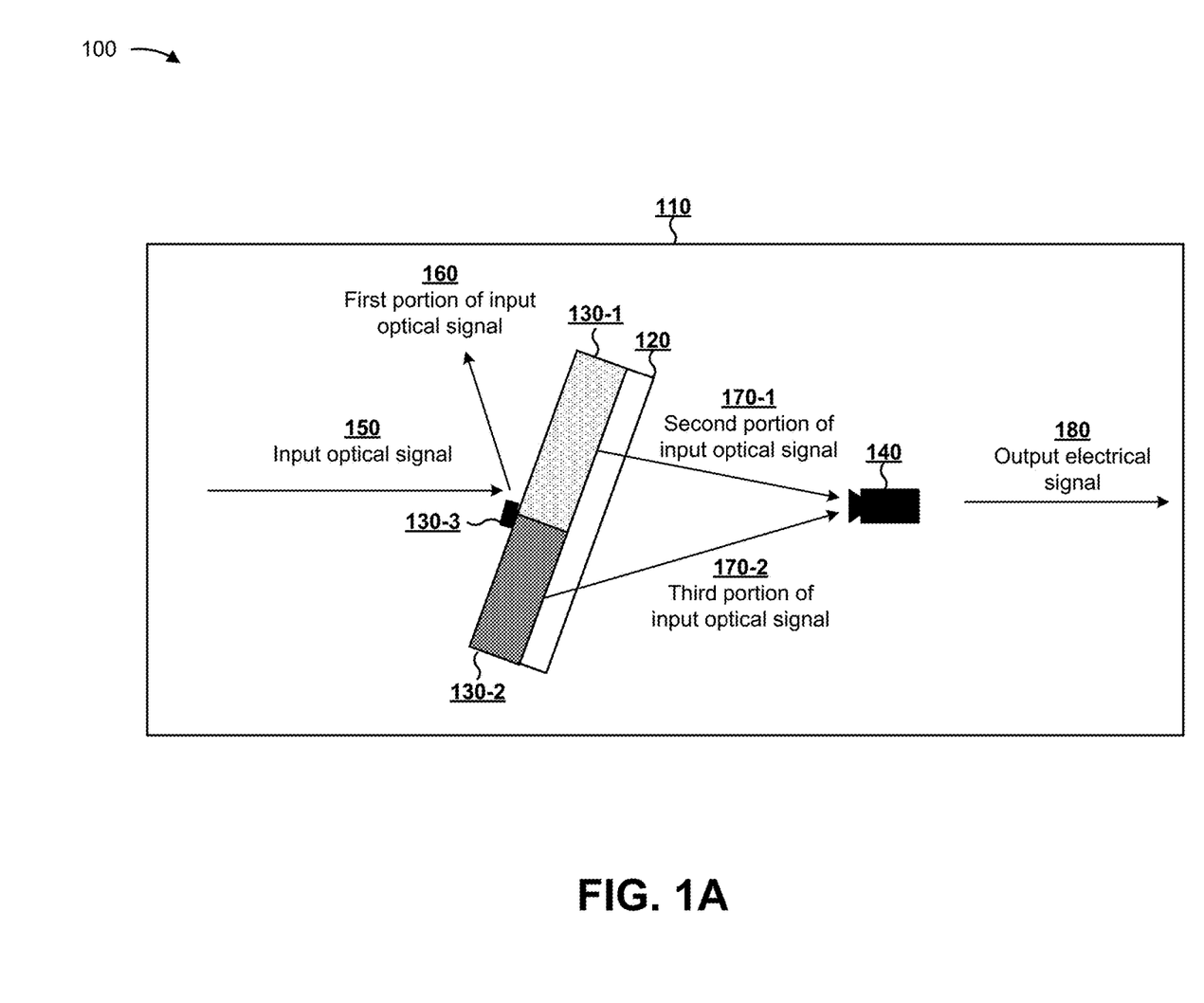
FIGS. 1A-1I are diagrams of an overview of an example implementation described herein.

FIGS. 1A-1I are diagrams of an overview of example implementations 100-108 described herein. As shown in FIG. 1A, example implementation 100 includes a sensor system 110. Sensor system 110 may be a portion of an optical system, and may provide an electrical output corresponding to a sensor determination. Sensor system 110 includes an optical filter structure 120, which includes component filter 130-1, component filter 130-2, and an absorber 130-3 (e.g., with less than a threshold reflectivity); and an optical sensor 140. Collectively, component filter 130-1, component filter 130-2, and absorber 130-3 may be referred to as optical filter 130. For example, optical filter structure 120 may include an optical filter 130 that performs a first passband filtering functionality for a first passband associated with component filter 130-1 and that performs a second passband filtering functionality for a second passband associated with component filter 130-2.

Although some implementations, described herein, may be described in terms of an optical filter in a sensor system, implementations described herein may be used in another type of system, may be used external to a sensor system, and/or the like.

As further shown in FIG. 1A, and by reference number 150, an input optical signal is directed toward optical filter structure 120. The input optical signal may include, but is not limited to, light associated with a particular spectral range, such as a spectral range of from approximately 400 nm to approximately 700 nm, a spectral range of from approximately 420 nm to approximately 630 nm, a spectral range of from approximately 700 nm to approximately 1100 nm, a spectral range of from approximately 750 nm to approximately 950 nm, a spectral range of from approximately 400 nm to approximately 1100 nm, a sub-range thereof, and/or the like. For example, visible light and NIR light may be reflected off an iris of a subject toward optical sensor 140, and may be filtered by optical filter 130 to provide the visible light toward a first portion of optical sensor 140 and NIR light toward a second portion of optical sensor 140. In another example, an optical transmitter may direct a spectral range of light toward optical sensor 140 for another functionality, such as a testing functionality, a sensing functionality, a communications functionality, and/or the like.

As further shown in FIG. 1A, and by reference number 160, a first portion of the optical signal with a first spectral range is not passed through by optical filter 130 and optical filter structure 120. For example, dielectric filter stacks of dielectric thin film layers, which may include high index material layers and low index material layers of optical filter 130, may cause the first portion of light to be reflected in a first direction, to be absorbed, and/or the like. In this case, the first portion of light may be a threshold portion of light incident on optical filter 130 not included in a bandpass of component filters 130-1 and/or 130-2, such as greater than 95% of light not within a particular spectral range.

In some implementations, the first portion of the optical signal may include a first component portion reflected by component filter 130-1, a second component portion reflected by component filter 130-2, and a third component portion absorbed and/or reflected by absorber 130-3 (which may sometimes be termed a "mirror," a "dark mirror," and/or the like). For example, component filter 130-1 may pass visible light, and may reflect NIR light and other light of the input optical signal. In contrast, component filter 130-2 may pass NIR light, and may reflect visible light and other light of the input optical signal. Further, absorber 130-3 may absorb and suppress reflection of all spectral ranges of light, thereby reducing cross-talk between light passed by component filter 130-1 and light passed by component filter 130-2. In some implementations, an absorber, such as absorber 130-3 may be associated with absorbing a threshold percentage of light, such as greater than approximately 50%, greater than approximately 80%, greater than approximately 90%, greater than approximately 95%, greater than approximately 99%, and/or the like. A second portion and a third portion of the optical signal may be passed as a filtered input optical signal.

As shown by reference number 170-1, the second portion of the optical signal is passed through by component filter 130-1 and optical filter structure 120. For example, component filter 130-1 may pass through the second portion of light with a second spectral range in a second direction toward optical sensor 140. In this case, the second portion of light may be a threshold portion of light incident on component filter 130-1 within a bandpass of component filter 130-1, such as greater than 50% of incident light in a spectral range for visible light.

As shown by reference number 170-2, the third portion of the optical signal is passed through by component filter 130-2 and optical filter structure 120. For example, component filter 130-2 may pass through the third portion of light with a third spectral range in a third direction toward optical sensor 140. In this case, the third portion of light may be a threshold portion of light incident on component filter 130-2 within a bandpass of component filter 130-2, such as greater than 50% of incident light in a spectral range for NIR light. In this way, a single optical filter structure 120 with multiple component filters 130 disposed onto the single optical filter structure 120 (e.g., using a photolithography technique) may pass multiple, different spectral ranges of light to optical sensor 140, thereby enabling multi-spectral sensing, such as to perform NIR light and RGB light based iris recognition, low-light security photography, and/or the like.

As further shown in FIG. 1A, based on the second portion and the third portion of the optical signal being passed to optical sensor 140, optical sensor 140 may provide an output electrical signal 180 for sensor system 110, such as for use in imaging, iris recognition, low-light light sensing, detecting the presence of an object, performing a measurement, facilitating communication, and/or the like. In some implementations, another arrangement of component filters 130 and optical sensor 140 may be utilized. For example, rather than passing the second portion and the third portion of the optical signal collinearly with the input optical signal, optical filter 130 may direct the second portion and the third portion of the optical signal in another direction toward a differently located optical sensor 140.

Figure 1B:
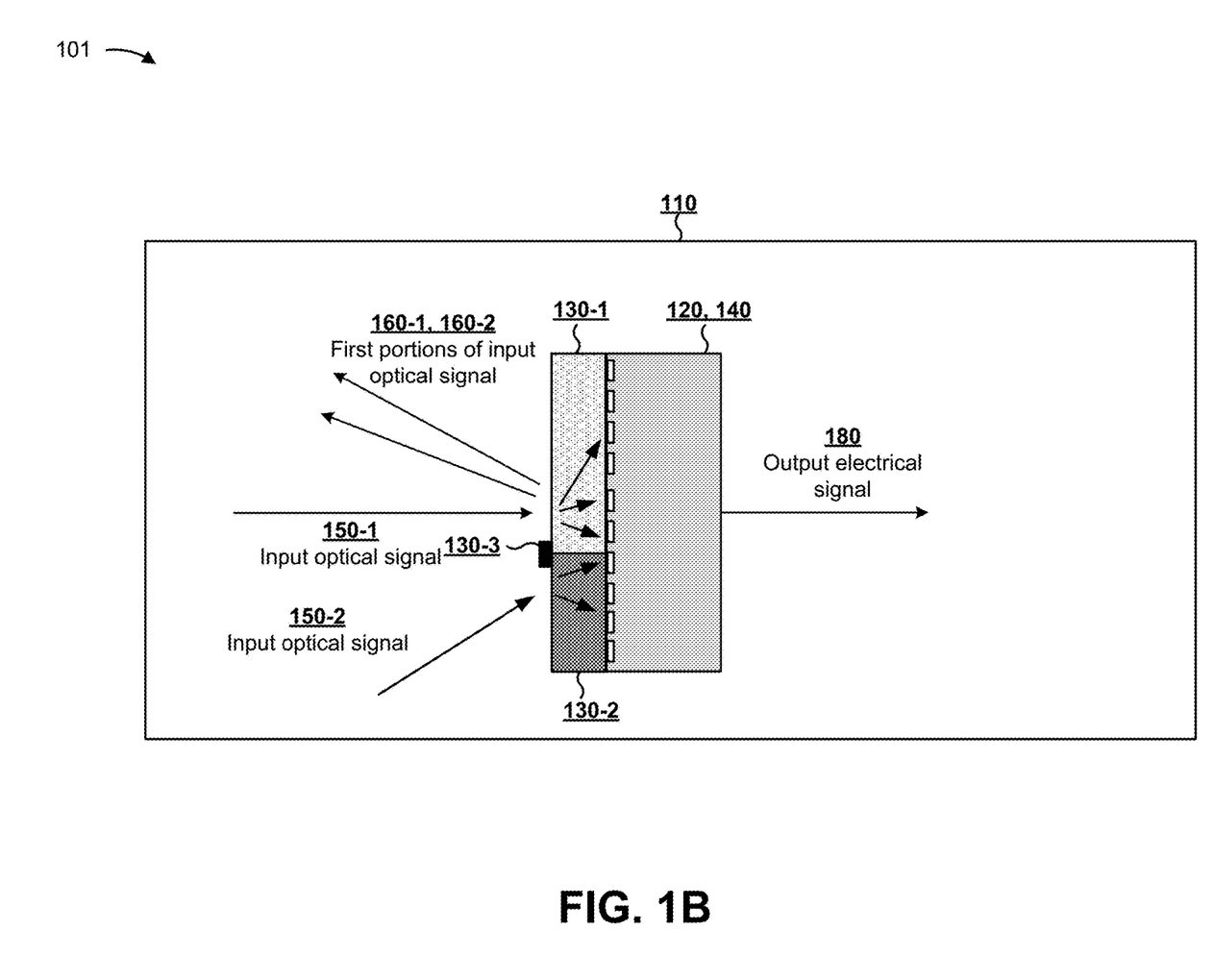

As shown in FIG. 1B, another example implementation 101 includes a set of sensor elements of a sensor element array forming optical sensor 140 and integrated into a substrate of optical filter structure 120. In this case, component filters 130 are disposed directly onto the substrate (e.g., using a photolithography procedure, a sputter deposition procedure, an etching procedure, a combination thereof, and/or the like). Input optical signals 150-1 and 150-2 are received at multiple different angles and first portions 160-1 and 160-2 of input optical signals 150-1 and 150-2 are reflected at multiple different angles. In this case, second portions of input optical signals 150-1 and 150-2 are passed as filtered input optical signals with multiple spectral ranges through component filters 130 to a sensor element array forming optical sensor 140, which provides an output electrical signal 180. For example, the second portions of input optical signals 150-1 and 150-2 may include light with a first spectral range (e.g., visible light) passed by component filter 130-1 and light with a second spectral range (e.g., NIR light) passed by component filter 130-2.

Figure 1C:
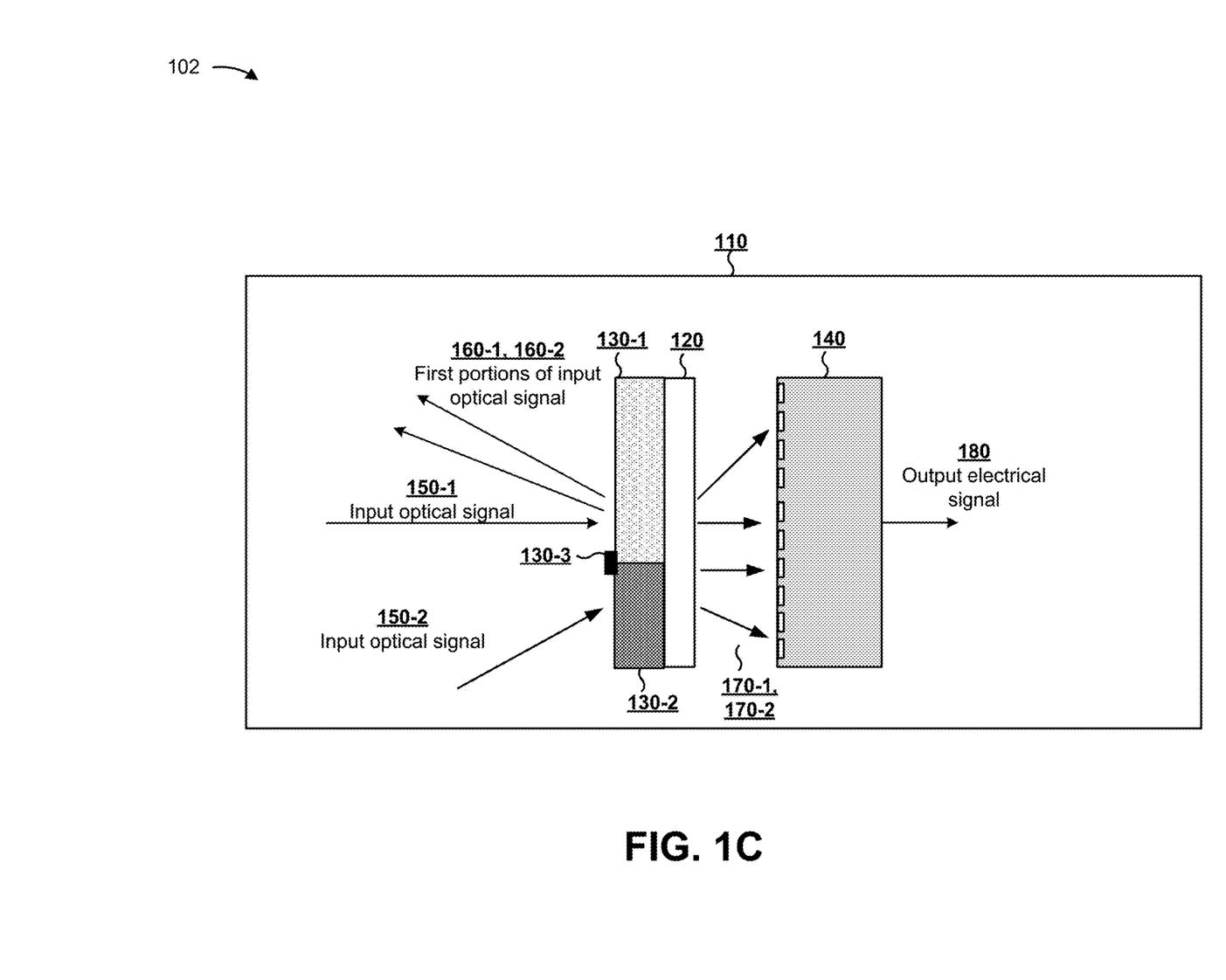

As shown in FIG. 1C, another example implementation 102 includes a set of sensor elements of a sensor element array forming optical sensor 140 and separated from an optical filter structure 120 (e.g., by free space in a free space optics type of optical system). In this case, component filters 130 are disposed onto optical filter structure 120, which may be a glass substrate, a silica substrate, and/or the like. Input optical signals 150-1 and 150-2 are received at multiple different angles at optical filter 130. First portions 160-1 and 160-2 of the input optical signals 150-1 and 150-2 are reflected and second portions 170-1 and 170-2 of the input optical signals 150-1 and 150-2 are passed by component filters 130 and optical filter structure 120. Based on receiving second portions 170-1 and 170-2, the sensor element array provides an output electrical signal 180.

Although some implementations, described herein, are described in terms of an NIR light passband filter and a visible light (e.g., RGB light) passband filter, other combinations of multiple spectral ranges of filters are possible, such as a first NIR light passband filter and a second NIR light passband filter, a visible light passband filter and an IR blocker filter, a visible light passband filter and an ultraviolet (UV) light passband filter, and/or the like. Similarly, although some implementations, described herein, are described in terms of two filters disposed onto a single substrate, other quantities of filters are possible, such as 3 filters, 4 filters, 10 filters, 100 filters, and/or the like.

Figure 1D:
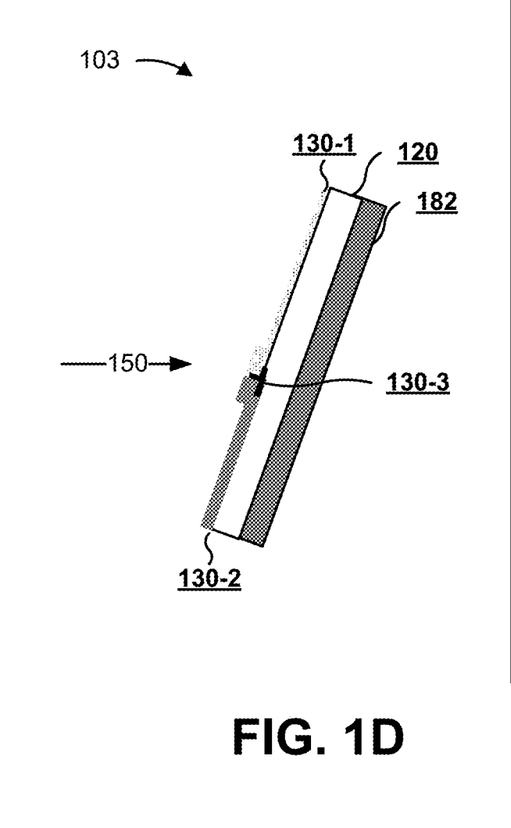
Figure 1E:
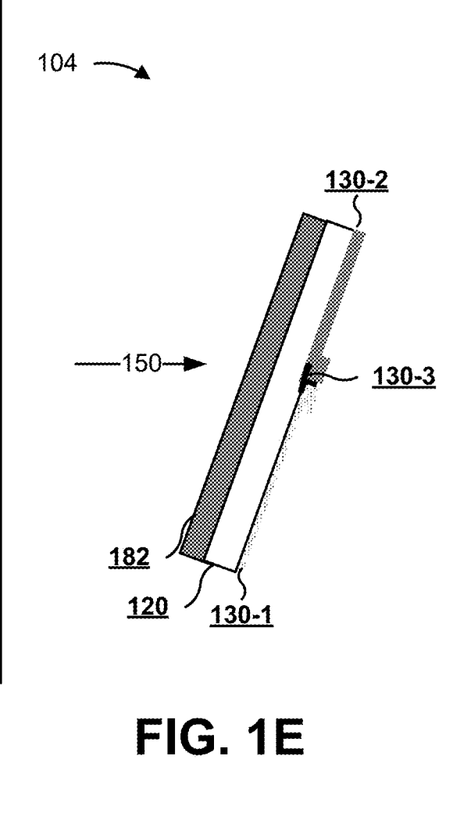
Figure 1F:
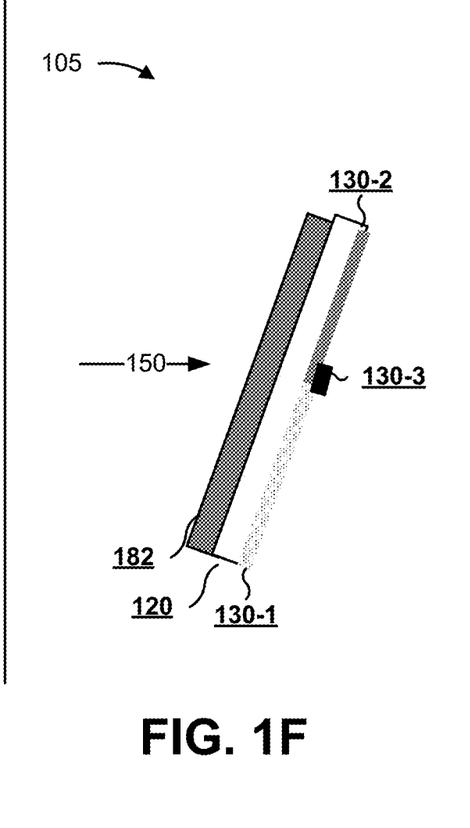

As shown in FIG. 1D, another example implementation 103 includes another configuration for an optical filter. For example, in example implementation 103, an anti-reflectance coating 182 is disposed onto a surface of optical filter structure 120. Additionally, or alternatively, absorber 130-3 is positioned such that component filters 130-1 and 130-2 cover at least a portion of absorber 130-3. In other words, absorber 130-3 is positioned between a portion of component filters 130-1 and 130-2 and optical filter structure 120. In this case, input optical signal 150 is directed toward a side of optical filter structure 120 onto which component filters 130 are disposed. As shown in FIG. 1E, in another example implementation 104, input optical signal 150 can be directed toward another side of optical filter structure 120 onto which anti-reflectance coating 182 is disposed. As shown in FIG. 1F, in another example implementation 105, absorber 130-3 may be disposed onto a surface of component filters 130-1 and 130-2. In other words, absorber 130-3 may cover a portion of component filters 130-1 and 130-2. In this case, input optical signal 150 may be directed toward an anti-reflectance coating 182 side of optical filter structure 120. In another example, input optical signal 150 may be directed to a component filters 130 side of optical filter structure 120. Although described herein in terms of free-space optics, example implementations described herein may be used in free-space optics, non-free-space optics, a combination of free-space optics and non-free-space optics, and/or the like.

Figure 1G:
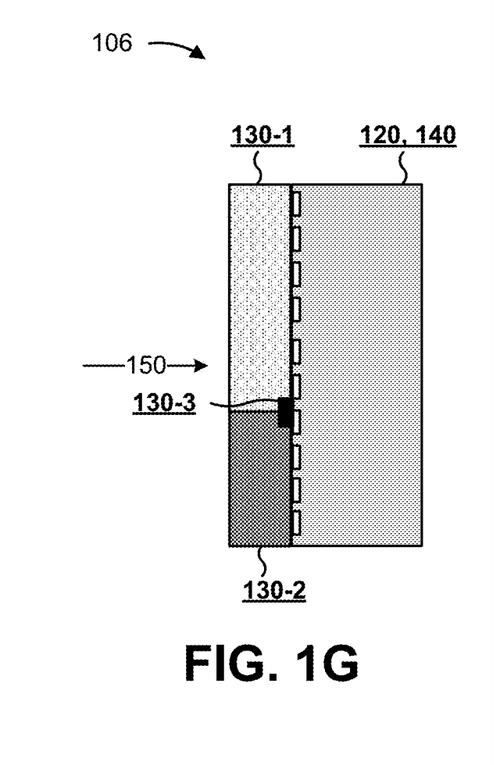
Figure 1H:
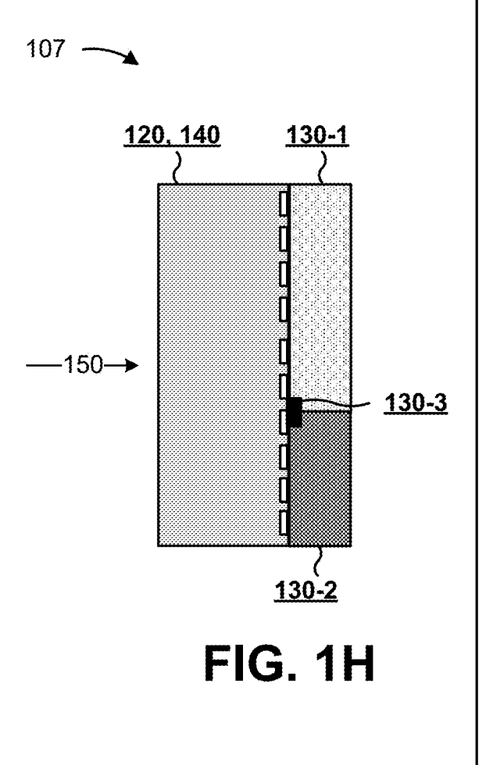
Figure 1I:
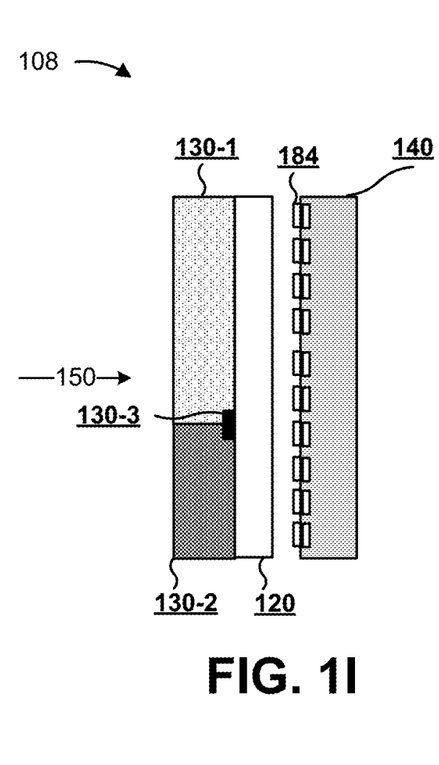

As shown in FIG. 1G, another example implementation 106 may include component filters 130 disposed directly onto optical sensor 140, which may form optical filter structure 120 and may include a set of sensor elements. In this case, absorber 130-3 may be disposed under component filters 130-1 and 130-2. In other words, component filters 130-1 and 130-2 may at least partially cover absorber 130-3, which may be disposed between component filters 130-1 and 130-2 and optical sensor 140. In this case, input optical signal is directed toward a component filters 130 side of optical sensor 140. As shown in FIG. 1H, in another example implementation 107, input optical signal 150 can be directed toward another side of optical sensor 140. In some implementations, an anti-reflection coating may be disposed onto the other side of optical sensor 140, between optical sensor 140 and component filters 130, onto a surface of component filters 130, and/or the like. In some implementations, absorber 130-3 may be aligned with one or more sensor elements of the set of sensor elements of optical sensor 140, aligned offset from one or more sensor elements, and/or the like. As shown in FIG. 1I, in another example, a set of microlenses 184 may be aligned with one or more sensor elements of the set of sensor elements of optical sensor 140. In this case, component filters 130 are disposed onto optical filter structure 120, which is separated by free space from optical sensor 140 and the set of sensor elements. In some implementations, the set of microlenses 184 may be disposed onto a surface of optical sensor 140. In some implementations, the set of microlenses 184 may be disposed onto a surface of, for example, optical filter structure 120, component filters 130, and/or the like to direct light to the set of sensor elements, focus light for the set of sensor elements, and/or the like.

As indicated above, FIGS. 1A-1I are provided merely as examples. Other examples are possible and may differ from what was described with regard to FIGS. 1A-1I.

Figure 2:
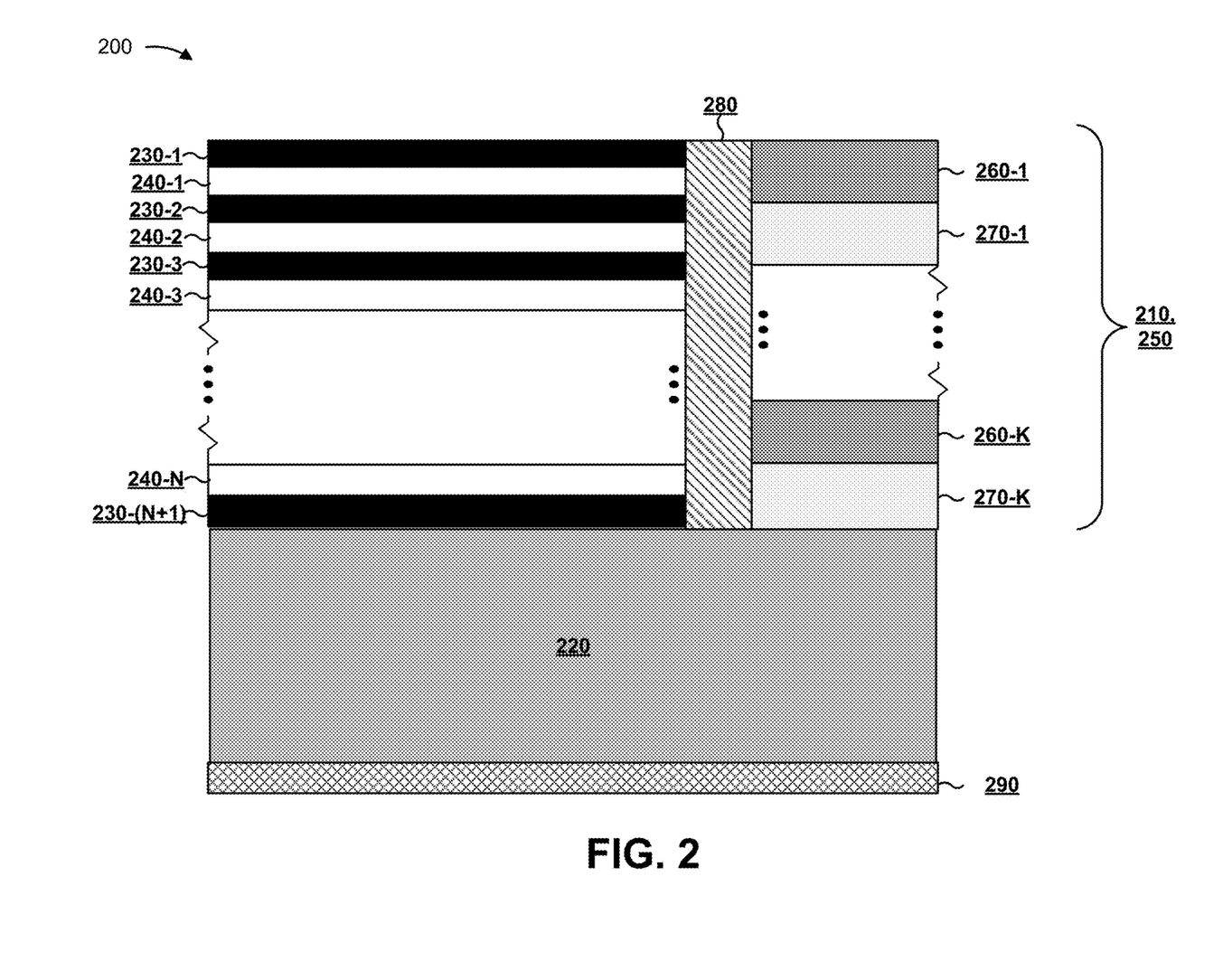
FIG. 2 is a diagram of an example implementation of an optical filter described herein.

FIG. 2 is a diagram of an example optical filter 200. Optical filter 200 includes a first component filter 210, which is disposed on a substrate 220 and includes a set of layers 230 and a set of layers 240. Optical filter 200 includes a second component filter 250, which is disposed on substrate 220 and includes a set of layers 260 and a set of layers 270. In some implementations, optical filter 200 includes an absorber 280 and/or a filter layer 290 (e.g., an anti-reflectance coating).

Component filter 210 includes a set of optical filter layers. For example, component filter 210 includes a first set of layers 230-1 through 230-N (N≥1) (e.g., high refractive index layers (H layers)) and a second set of layers 240-1 through 240-(N+1) (e.g., low refractive index layers (L layers)). In some implementations, layers 230 and 240 may be arranged in a particular order, such as an (H-L)m (m≥1) order, an (H-L)$_m$-H order, an (L-H)$_m$ order, an L-(H-L)$_m$ order, and/or the like. For example, as shown, layers 230 and 240 are positioned in an (H-L)$_n$-H order with an H layer disposed at a surface of optical filter 200 and an H layer contiguous to a surface of substrate 220. In some implementations, one or more other layers may be included in optical filter 200, such as one or more protective layers, one or more layers to provide one or more other filtering functionalities (e.g., a blocker, an anti-reflection coating, etc.), and/or the like.

Layers 230 may include a set of H layers, such as a material with a refractive index greater than the refractive index of the L layers, a refractive index greater than 2.0, a refractive index greater than 3.0, a refractive index greater than 4.0, a refractive index greater than 4.5, a refractive index greater the 4.6, and/or the like, over a particular spectral range (e.g., the spectral range of approximately 400 nm to approximately 700 nm, the spectral range of approximately 420 nm to approximately 630 nm, and/or the like). In some implementations, layers 230 may include hydrogenated germanium layers, hydrogenated silicon layers, annealed hydrogenated germanium, and/or the like.

Layers 240 may include a set of L layers, such as a set of silicon dioxide (SiO$_2$) layers, a set of aluminum oxide (Al$_2$O$_3$) layers, a set of titanium dioxide (TiO$_2$) layers, a set of niobium pentoxide (Nb$_2$O$_5$) layers, a set of tantalum pentoxide (Ta$_2$O$_5$) layers, a set of magnesium fluoride (MgF$_2$) layers, and/or the like. In this case, layers 240 may be selected to include a refractive index lower than that of the layers 230 over, for example, a particular spectral range (e.g., the spectral range of approximately 400 nm to approximately 700 nm, the spectral range of approximately 420 nm to approximately 630 nm, and/or the like). For example, layers 240 may be selected to be associated with a refractive index of less than 3 over the particular spectral range.

In another example, layers 240 may be selected to be associated with a refractive index of less than 2.5 over the particular spectral range (e.g., the spectral range of approximately 400 nm to approximately 700 nm, the spectral range of approximately 420 nm to approximately 630 nm, and/or the like). In another example, layers 240 may be selected to be associated with a refractive index of less than 2 over the particular spectral range (e.g., the spectral range of approximately 400 nm to approximately 700 nm, the spectral range of approximately 420 nm to approximately 630 nm, and/or the like). In another example, layers 240 may be selected to be associated with a refractive index of less than 1.5 over the particular spectral range (e.g., the spectral range of approximately 400 nm to approximately 700 nm, the spectral range of approximately 420 nm to approximately 630 nm, and/or the like). In some implementations, the particular material may be selected for layers 240 based on a desired width of an out-of-band blocking spectral range, a desired center-wavelength shift associated with a change of angle of incidence, and/or the like.

In some implementations, component filter 210 may be associated with a particular quantity of layers, m. For example, component filter 210 may include approximately 20 layers of alternating H layers and L layers. In another example, component filter 210 may be associated with another quantity of layers, such as a range of 2 layers to 100 layers, a range of 4 layers to 50 layers, and/or the like. In some implementations, each layer of component filter 210 may be associated with a particular thickness. For example, layers 230 and 240 may each be associated with a thickness of between approximately 5 nm and approximately 2000 nm, resulting in component filter 210 being associated with a thickness of between approximately 0.2 μm and 100 μm, between approximately 0.5 μm and 20 μm, between approximately 4 μm and 7 μm, and/or the like.

In some implementations, layers 230 and 240 may be associated with multiple thicknesses, such as a first thickness for layers 230 and a second thickness for layers 240, a first thickness for a first subset of layers 230 and a second thickness for a second subset of layers 230, a first thickness for a first subset of layers 240 and a second thickness for a second subset of layers 240, and/or the like. In this case, a layer thickness and/or a quantity of layers may be selected based on an intended set of optical characteristics, such as an intended passband, an intended transmissivity, and/or the like. For example, the layer thickness and/or the quantity of layers may be selected to permit optical filter 200 to be utilized for a spectral range of approximately 1100 nm to approximately 2000 nm, at a center wavelength of approximately 1550 nm, and/or the like.

Component filter 250 includes a set of optical filter layers. For example, component filter 250 includes a first set of layers 260-1 through 260-K (K≥1) (e.g., H layers) and a second set of layers 270-1 through 270-K (e.g., L layers). In some implementations, layers 260 and 270 may be arranged in a particular order, such as an (H-L)$_m$ (k≥1) order. Layers 260 may include a set of H layers, such as a material with a refractive index greater than the refractive index of the L layers, a refractive index greater than 2.0, a refractive index greater than 3.0, a refractive index greater than 4.0, a refractive index greater than 4.5, a refractive index greater the 4.6, and/or the like, over a particular spectral range (e.g., the spectral range of approximately 400 nm to approximately 700 nm, the spectral range of approximately 420 nm to approximately 630 nm, and/or the like). In some implementations, layers 260 may include hydrogenated germanium layers, hydrogenated silicon layers, annealed hydrogenated germanium, and/or the like.

Layers 270 may include a set of L layers, such as a set of silicon dioxide (SiO$_2$) layers, a set of aluminum oxide (Al$_2$O$_3$) layers, a set of titanium dioxide (TiO$_2$) layers, a set of niobium pentoxide (Nb$_2$O$_5$) layers, a set of tantalum pentoxide (Ta$_2$O$_5$) layers, a set of magnesium fluoride (MgF$_2$) layers, and/or the like. In this case, layers 270 may be selected to include a refractive index lower than that of the layers 260 over, for example, a particular spectral range (e.g., the spectral range of approximately 400 nm to approximately 700 nm, the spectral range of approximately 420 nm to approximately 630 nm, and/or the like). For example, layers 270 may be selected to be associated with a refractive index of less than 3 over the particular spectral range. In some implementations, a quantity of layers 260 and/or layers 270 may be different from a quantity of layers 230 and/or layers 240, the same as a quantity of layers 230 and/or layers 240, and/or the like. In some implementations, a thickness of layers 260 and/or layers 270 may be different from a thickness of layers 230 and/or layers 240, the same as a thickness of layers 230 and/or layers 240, and/or the like.

In some implementations, component filters 210 and 250 may be fabricated using a sputtering procedure and a photolithography procedure. For example, component filter 210 may be fabricated using a pulsed-magnetron based sputtering procedure to sputter alternating layers 230 and 240 on a glass substrate. A photolithography procedure and a lift-off procedure may be used to remove layers 230 and 240 from a portion of substrate 220 that is to be used for component filter 250, for absorber 280, and/or the like. Similarly, component filter 250 may be fabricated using a pulsed-magnetron based sputtering procedure to sputter alternating layers 260 and 270 on substrate 220 and onto component filter 210. In this case, the photolithography procedure and the lift-off procedure are used to remove layers 260 and 270 from component filter 210, resulting in component filter 210 and component filter 250 being approximately contiguous (e.g., contiguous, separated by absorber 280, and/or the like). Similarly, absorber 280 may be fabricated using a pulsed-magnetron based sputtering procedure to sputter layers of absorber 280 onto substrate 220 and onto component filters 210 and 250. In this case, the photolithography procedure and the lift-off procedure are used to remove layers of absorber 280 from component filters 210 and 250, resulting in component filters 210 and 250 being disposed on a common substrate 220 with absorber 280 covering a transition zone between component filters 210 and 250.

In some implementations, a particular ordering of sputter deposition and lift-off may be performed. For example, an NIR bandpass filter (e.g., component filter 210) may be deposited followed by an RGB bandpass filter (e.g., component filter 250) and followed by an absorber (e.g., absorber 280). Similarly, an absorber may be deposited followed by an RGB bandpass filter and followed by an NIR bandpass filter. Another ordering and/or combination of filters may be possible.

In some implementations, component filters 210 and 250 may be associated with an incident medium, such as an air medium or glass medium. In some implementations, optical filter 200 may be disposed between a set of prisms. In some implementations, component filters 210 and 250 may be aligned to a set of microlenses. For example, a microlens array may be aligned between component filters 210 and 250 and a sensor element array to direct light passing through component filters 210 and 250 into sensor elements of the sensor element array. In some implementations, an annealing procedure may be utilized to fabricate component filters 210 and/or 250. For example, after sputter deposition of layers 230 and 240 on a substrate, after sputter deposition of layers 260 and 270 on a substrate, and/or the like optical filter 200 may be annealed to improve one or more optical characteristics of optical filter 200, such as reducing an absorption coefficient of optical filter 200 relative to another optical filter for which an annealing procedure is not performed.

In some implementations, component filters 210 and 250 are attached to a substrate, such as substrate 220. For example, component filters 210 and 250 may be attached to a glass substrate, a silica substrate, and/or the like using a coating technique, an epoxy technique, and/or the like. In some implementations, absorber 280 may be disposed onto a portion of component filters 210 and 250, between a portion of component filters 210 and 250, underneath a portion of component filters 210 and 250, and/or the like. In this way, a transition zone between component filters 210 and 250 may be blocked by absorber 280, thereby reducing cross-talk between light passing through component filter 210 and light passing through component filter 250.

Moreover, based on using photolithography and sputtering to deposit component filters 210 and 250 on a common substrate 220, the separation between component filters 210 may be reduced to less than approximately 50 µm, less than approximately 30 µm, less than approximately 20 µm, less than approximately 10 µm, and/or the like. In some implementations, a filter layer 290 may be disposed onto substrate 220. For example, an anti-reflectance (AR) coating may be disposed onto a surface of substrate 220 to reduce a loss of light at an interface between substrate 220 and an optical sensor to which optical filter 200 is attached and/or aligned.

As indicated above, FIG. 2 is provided merely as an example. Other examples are possible and may differ from what was described with regard to FIG. 2.

Figure 3:
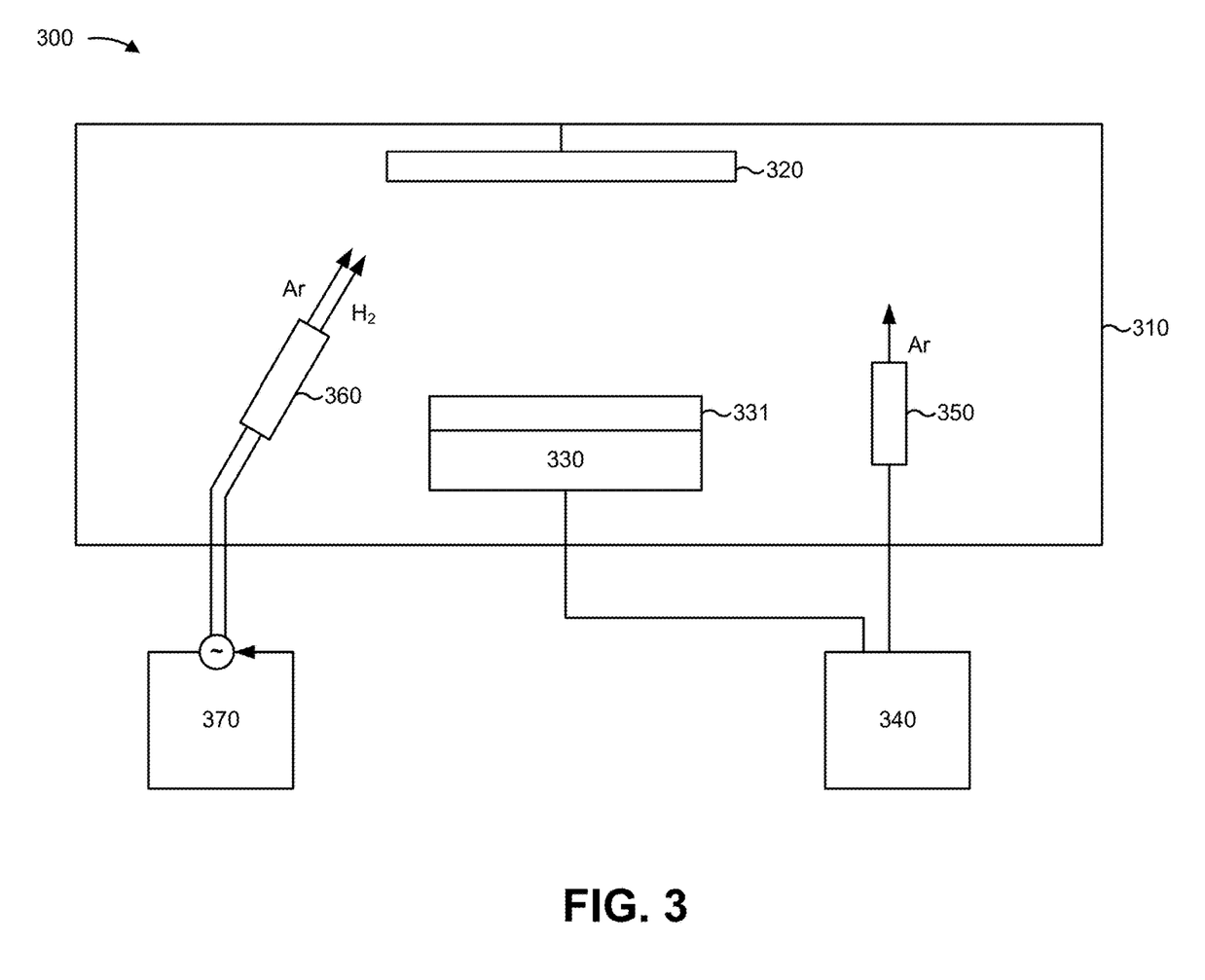
FIG. 3 is a diagram of a system for manufacturing an optical filter described herein.

FIG. 3 is diagram of an example 300 of a sputter deposition system for manufacturing an optical filter described herein.

As shown in FIG. 3, example 300 includes a vacuum chamber 310, a substrate 320, a cathode 330, a target 331, a cathode power supply 340, an anode 350, a plasma activation source (PAS) 360, and a PAS power supply 370. Target 331 may include a material that is to be sputter deposited onto substrate 320, such as a germanium material, a silicon material, a silicon dioxide ($SiO_2$) material, and/or the like. PAS power supply 370 may be utilized to power PAS 360 and may include a radio frequency (RF) power supply. Cathode power supply 340 may be utilized to power cathode 330 and may include a pulsed direct current (DC) power supply.

With regard to FIG. 3, target 331 is sputtered in the presence of hydrogen ($H_2$), as well as an inert gas, such as argon, to deposit, for example, a hydrogenated germanium material as a layer on substrate 320. The inert gas may be provided into the chamber via anode 350 and/or PAS 360. Hydrogen is introduced into the vacuum chamber 310 through PAS 360, which serves to activate the hydrogen. Additionally, or alternatively, cathode 330 may cause hydrogen activation (e.g., in this case, hydrogen may be introduced from another part of vacuum chamber 310) or anode 350 may cause hydrogen activation (e.g., in this case, hydrogen may be introduced into vacuum chamber 310 by anode 350). In some implementations, the hydrogen may take the form of hydrogen gas, a mixture of hydrogen gas and a noble gas (e.g., argon gas), and/or the like. PAS 360 may be located within a threshold proximity of cathode 330, allowing plasma from PAS 360 and plasma from cathode 330 to overlap. The use of the PAS 360 allows a sputter deposited layer to be deposited at a relatively high deposition rate. In some implementations, the sputter deposited layer is deposited at a deposition rate of approximately 0.05 nm/s to approximately 2.0 nm/s, at a deposition rate of approximately 0.5 nm/s to approximately 1.2 nm/s, at a deposition rate of approximately 0.8 nm/s, and/or the like.

A photolithography procedure may be used in connection with the sputtering procedure to deposit multiple component filters onto substrate 320 (e.g., an NIR bandpass filter and an RGB bandpass filter). For example, a photoresist material and a photomask may be used to expose a first portion of substrate 320 to deposition of one or more layers for a first component optical filter, and another photoresist material and another photomask may be used to expose a second portion of substrate 320 to deposition of one or more layers for a second component optical filter. Similarly, a photoresist material and a photomask may be used to attach an absorber to a transition zone at an edge of the first component optical filter and the second component optical filter. In some implementations, a group of layers of a first component filter may be sputter deposited and the first component filter may be a patterned first component filter (e.g., patterned using a photolithography technique or an etch technique applied to the group of layers of the first component filter), and a group of layers of a second component filter may be sputter deposited and the second component filter may be a patterned second component filter.

Although the sputtering procedure is described, herein, in terms of a particular geometry and a particular implementation, other geometries and other implementations are possible. For example, hydrogen may be injected from another direction, from a gas manifold in a threshold proximity to cathode 330, and/or the like. Although, described, herein, in terms of different configurations of components, different relative concentrations of a sputtering material may also be achieved using different materials, different manufacturing processes, and/or the like.

As indicated above, FIG. 3 is provided merely as an example. Other examples are possible and may differ from what was described with regard to FIG. 3.

Figure 4:
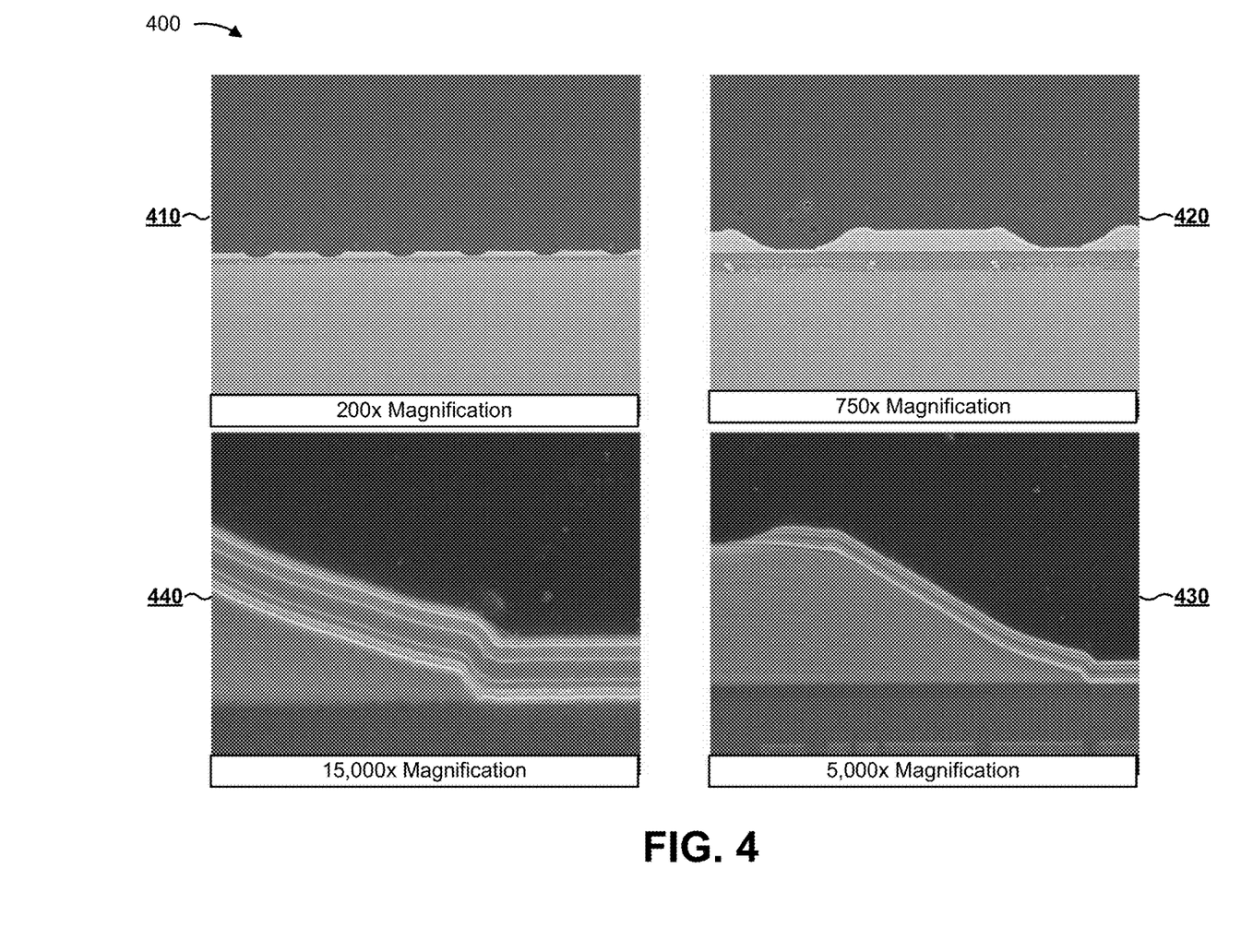
FIG. 4 is a diagram of characteristics relating to an optical filter described herein.

FIG. 4 shows an example implementation 400 of an optical filter described herein. As shown in FIG. 4, charts 410-440 provide a set of cross-section views of an optical filter described herein.

As shown in FIG. 4, and by charts 410-440, multiple component filters may be disposed onto a common substrate. As shown in charts 430 and 440, a set of layers of an absorber may be disposed in a transition zone at an edge of a component filter to block light from passing through the transition zone. In this way, cross-talk from light passing through a first component filter in proximity to the transition zone and light passing through a second component filter in proximity to the transition zone may be reduced.

As indicated above, FIG. 4 is provided merely as an example. Other examples are possible and may differ from what was described with regard to FIG. 4.

In this way, multiple component filters may be integrated onto a single substrate to form an optical filter for multispectral sensing, such as for an iris recognition functionality, an iris detection functionality, a low-light security photography functionality, and/or the like. Based on utilizing a sputter deposition procedure and/or a photolithography procedure to deposit multiple component filters onto a single substrate, a separation between the multiple component filters may be reduced relative to attaching multiple substrates using an adhesive. Moreover, a mechanical durability of the optical filter may be improved by depositing multiple component filters onto a single substrate relative to attaching multiple substrates together.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. An optical filter, comprising:
   a monolithic substrate;
   a first component filter integrated onto a first region of the monolithic substrate,
      the first component filter comprising a near infrared (NIR) bandpass filter, and
      the first component filter being associated with a spectral range from approximately 700 nm to approximately 1100 nm; and
   a second component filter integrated onto a second region of the monolithic substrate,
      the second component filter comprising a red-green-blue (RGB) bandpass filter, and
   a separation between the first component filter and the second component filter being less than approximately 50 micrometers (µm).

2. The optical filter of claim 1, further comprising:
   an absorber disposed at a transition zone of the optical filter,
      the transition zone being at an edge of the first component filter and the second component filter.

3. The optical filter of claim 2, where the first component filter and the second component filter are disposed between the absorber and the monolithic substrate.

4. The optical filter of claim 2, where the absorber is disposed between the first component filter and the second component filter.

5. The optical filter of claim 2, where the absorber is disposed between the first component filter and the monolithic substrate and between the second component filter and the monolithic substrate.

6. The optical filter of claim 1, further comprising:
   an anti-reflectance coating disposed onto a surface of the monolithic substrate, such that the monolithic substrate is disposed between the anti-reflectance coating and the first component filter and between the anti-reflectance coating and the second component filter.

7. The optical filter of claim 1, where the monolithic substrate is a glass substrate or a silica substrate.

8. The optical filter of claim 1, where the first component filter and the second component filter are disposed onto the monolithic substrate using a sputter deposition procedure.

9. The optical filter of claim 1, where the first component filter and the second component filter are disposed onto the monolithic substrate using a photolithography procedure.

10. The optical filter of claim 1, where the first component filter is associated with a first spectral range and the second component filter is associated with a second, different spectral range.

11. The optical filter of claim 1, where the second component filter is associated with a spectral range of from approximately 400 nm to approximately 700 nm.

12. The optical filter of claim 1, where the second component filter is associated with a spectral range of from approximately 420 nm to approximately 630 nm.

13. The optical filter of claim 1, where the separation between the first component filter and the second component filter is less than approximately 30 µm.

14. The optical filter of claim 1,
wherein the first component filter includes one or more first filter layers,
wherein the second component filter includes one or more second filter layers, and
wherein a first thickness associated with at least one layer of the one or more first filter layers is different from a second thickness associated with at least one layer of the one or more second filter layers.

15. An optical system, comprising:
an optical filter including a plurality of component filters configured to filter an input optical signal and provide a filtered input optical signal,
the plurality of component filters being associated with two or more spectral ranges,
the plurality of component filters including:
a first component filter that includes a first set of filter layers and a second set of filter layers, and
a second component filter that includes a third set of filter layers and a fourth set of filter layers, and
a first thickness associated with at least one layer of the first set of filter layers or the second set of filter layers is different from a second thickness associated with at least one layer of the third set of filter layers or the fourth set of filter layers; and
an optical sensor configured to receive the filtered input optical signal and provide an output electrical signal.

16. The optical system of claim 15, where the filtered input optical signal includes two or more component filtered input optical signals corresponding to the two or more spectral ranges.

17. The optical system of claim 15, where the output electrical signal is related to performing at least one of:
an iris detection functionality,
an iris recognition functionality, or
an low-light security photography functionality.

18. A bandpass filter, comprising:
a first patterned component filter, comprising:
a first set of filter layers associated with a first refractive index and deposited using a sputter deposition technique, and
a second set of filter layers associated with a second refractive index that is less than the first refractive index and deposited using the sputter deposition technique; and a second patterned component filter, comprising:
a third set of filter layers associated with a third refractive index and deposited using the sputter deposition technique, and
a fourth set of filter layers associated with a fourth refractive index and deposited using the sputter deposition technique,
where the first patterned component filter is separated from the second patterned component filter by less than approximately 30 micrometers (µm),
where the second patterned component filter comprises a red-green-blue (RGB) bandpass filter,
where the first patterned component filter is associated with a first bandpass and the second patterned component filter is associated with a second bandpass that is different from the first bandpass, and
where a first thickness associated with at least one of the first set of filter layers or the second set of filter layers is different from a second thickness associated with at least one of the third set of filter layers or the fourth set of filter layers.

19. The bandpass filter of claim 18, where at least one filter layer of the first set of filter layers, the second set of filter layers, the third set of filter layers, or the fourth set of filter layers is one of:
a silicon based material,
a hydrogenated silicon based material,
a germanium based material,
a hydrogenated germanium based material,
a silicon dioxide ($SiO_2$) material,
an aluminum oxide ($Al_2O_3$) material,
a titanium dioxide ($TiO_2$) material,
a niobium pentoxide ($Nb_2O_5$) material,
a tantalum pentoxide ($Ta_2O_5$) material, or
a magnesium fluoride ($MgF_2$) material.

20. The bandpass filter of claim 18, where at least one filter layer of the first set of filter layers, the second set of filter layers, the third set of filter layers, or the fourth set of filter layers is annealed.

* * * * *